(12) United States Patent
Nakajima

(10) Patent No.: US 7,679,191 B2
(45) Date of Patent: Mar. 16, 2010

(54) POLYSILICON FILM WITH INCREASED ROUGHNESS

(75) Inventor: Kouji Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 535 days.

(21) Appl. No.: 11/476,581

(22) Filed: Jun. 29, 2006

(65) Prior Publication Data
US 2007/0029599 A1    Feb. 8, 2007

(30) Foreign Application Priority Data
Jul. 13, 2005    (JP) .............................. 2005-203910

(51) Int. Cl.
*H01L 23/48*    (2006.01)
*H01L 23/52*    (2006.01)

(52) U.S. Cl. ....................... 257/739; 257/412; 257/756; 257/741; 257/753; 257/754; 257/750

(58) Field of Classification Search ................. 438/488, 438/919; 257/739, 741, 750, 753, 754, 412, 257/756
See application file for complete search history.

(56) References Cited

U.S. PATENT DOCUMENTS

| | | | | |
|---|---|---|---|---|
| 4,810,666 A * | 3/1989 | Taji | ............................. | 438/297 |
| 5,084,752 A * | 1/1992 | Satoh et al. | .................. | 257/786 |
| 5,243,210 A * | 9/1993 | Naruke | ........................ | 257/320 |
| 5,316,976 A * | 5/1994 | Bourg et al. | ................. | 438/612 |
| 5,358,733 A * | 10/1994 | Lur et al. | ..................... | 438/598 |
| 5,365,112 A | 11/1994 | Ohshima | | |
| 5,394,012 A * | 2/1995 | Kimura | ....................... | 257/739 |
| 5,424,581 A * | 6/1995 | Bourg et al. | ................. | 257/786 |
| 5,477,074 A * | 12/1995 | Yen | ............................. | 257/377 |
| 5,659,202 A * | 8/1997 | Ashida | ........................ | 257/758 |
| 5,705,841 A * | 1/1998 | Yu | ............................. | 257/355 |
| 5,793,111 A * | 8/1998 | Zamanian | .................... | 257/751 |
| 5,828,130 A * | 10/1998 | Miller et al. | ................. | 257/754 |
| 5,874,333 A * | 2/1999 | Chang et al. | ................. | 438/250 |
| 6,677,222 B1 * | 1/2004 | Mishima et al. | ............. | 438/488 |
| 6,756,627 B1 * | 6/2004 | Wu et al. | ..................... | 257/306 |
| 7,064,364 B2 * | 6/2006 | Okumura | ..................... | 257/288 |
| 2001/0001257 A1 * | 5/2001 | Sandhu et al. | ............... | 361/502 |

FOREIGN PATENT DOCUMENTS

JP        62004352 A  *  1/1987

(Continued)

OTHER PUBLICATIONS

Bashir et al., "Doping of Polycrystalline Silicon Films using an arsenic spin-on-glass source and surface smoothness", Journal of Vacuum Science Tehnology B, vol. 11, Issue 5 (attached).*

*Primary Examiner*—Sue Purvis
*Assistant Examiner*—Teresa M Arroyo
(74) *Attorney, Agent, or Firm*—Young & Thompson

(57) ABSTRACT

The semiconductor device, in which a flaking of a layer or an element is prevented, is provided. A bonding pad section 13 of a semiconductor device 1 includes a polysilicon film 131, a barrier metal film 133 provided on the polysilicon film 131 and a metallic electrode 134 provided on the barrier metal film 133. The surface roughness of the surface of the polysilicon film 131 in the side of the barrier metal film 133 is equal to or larger than 3 nm. Further, the polysilicon film 131 contains substantially no phosphorus.

20 Claims, 10 Drawing Sheets

FOREIGN PATENT DOCUMENTS

| | | | |
|---|---|---|---|
| JP | 63-067754 | * | 3/1988 |
| JP | 63-67754 | | 3/1988 |
| JP | 02168668 A | * | 6/1990 |
| JP | 5-175196 | | 7/1993 |
| JP | 05-335370 | | 12/1993 |
| JP | 09027514 A | * | 1/1997 |
| JP | 2000100816 A | * | 4/2000 |
| TW | 311257 A | * | 7/1997 |

* cited by examiner

DISTANCE

POLYSILICON FILM WITH INCREASED ROUGHNESS

This application is based on Japanese patent application No. 2005-203,910, the content of which is incorporated hereinto by reference.

BACKGROUND

1. Field of The Invention

The present invention relates to a semiconductor device.

2. Related Art

A type of semiconductor device 100 shown in FIG. 11 is known in the conventional technology. The semiconductor device 100 includes a silicon substrate (semiconductor substrate) 101, a field oxide film 102 provided on the silicon substrate 101 and a bonding pad section provided on the field oxide film 102 (see Japanese Patent Laid-Open No. S63-67, 754 (1988)). The bonding pad section comprises a doped polysilicon film 103, which is provided on the field oxide film 102 and is doped with phosphorus, a silicon dioxide film 104, which is formed so as to cover the polysilicon film 103, a doped polysilicon film 105, which is provided on the silicon dioxide film 104 and is doped with phosphorus, a molybdenum silicide film (barrier metal film) 106 provided on the doped polysilicon film 105, and an aluminum film 107 provided on the molybdenum silicide film 106.

A phosphosilicate glass (PSG) film or a borophosphosilicate glass (BPSG) film 108 having an opening is mounted on the molybdenum silicide film 106, and the aluminum film 107 is disposed in the opening of the film 108 of PSG or BPSG. Moreover, a type of semiconductor device described in Japanese Patent Laid-Open No. H5-175,196 (1993) is also known in a conventional technology. This semiconductor device includes a silicon substrate and a bonding pad section provided on the silicon substrate, and the bonding pad section includes a polysilicon film, a titanium-tungsten (TiW) layer (barrier metal film) provided on the polysilicon film and an aluminum (Al) alloy layer provided on the TiW layer.

Nevertheless, in the technologies described in Japanese Patent Laid-Open No. S63-67,754 (1988) and Japanese Patent Laid-Open No. H5-175,196 (1993), a flaking may be caused in the bonding pad section, when the bonding process is conducted.

SUMMARY OF THE INVENTION

The present inventors have assumed that an adhesiveness of the polysilicon film with the barrier metal film disposed on the polysilicon film is adversely affected by such flaking of the bonding pad section, and further the present inventors have assumed that an adhesiveness between the polysilicon film and the barrier metal film is adversely affected by a smoothness of the surface of the polysilicon film. It is considered that smoother surface of a polysilicon film provides a reduced surface area of a portion of the polysilicon film adhered onto the barrier metal film, so that an adhesive strength between the barrier metal film and the polysilicon film is reduced. Therefore, it can be assumed that a flaking is caused in the bonding pad section as a result the above-described reduced adhesiveness.

According to one aspect of the present invention, there is provided a semiconductor device, comprising: a semiconductor substrate; a field oxide film provided on said semiconductor substrate; and a bonding pad section formed on said field oxide film, wherein said bonding pad section includes: a polysilicon film provided on said field oxide film; a barrier metal film provided on said polysilicon film; and a metallic electrode provided on said barrier metal film, and wherein a surface roughness of a surface of said polysilicon film in the side of said barrier metal film is equal to or larger than 3 nm. Here, the surface roughness is an arithmetic mean roughness.

According to the above-described configuration, larger surface area of the polysilicon film can be ensured by providing the surface of the polysilicon film in the side of the barrier metal film having a surface roughness of equal to or higher than 3 nm, thereby achieving a coarse surface thereof. The adhesiveness between the polysilicon film and the barrier metal film can be improved by employing the above-described configuration. Therefore, a flaking of the bonding pad section can be prevented according to the present invention. In addition to above, the surface roughness of the surface of the polysilicon film in the side of the barrier metal film may be preferably equal to or lower than 20 nm, because a polysilicon film having a surface roughness of larger than 20 nm causes a difficulty in the manufacturing process.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
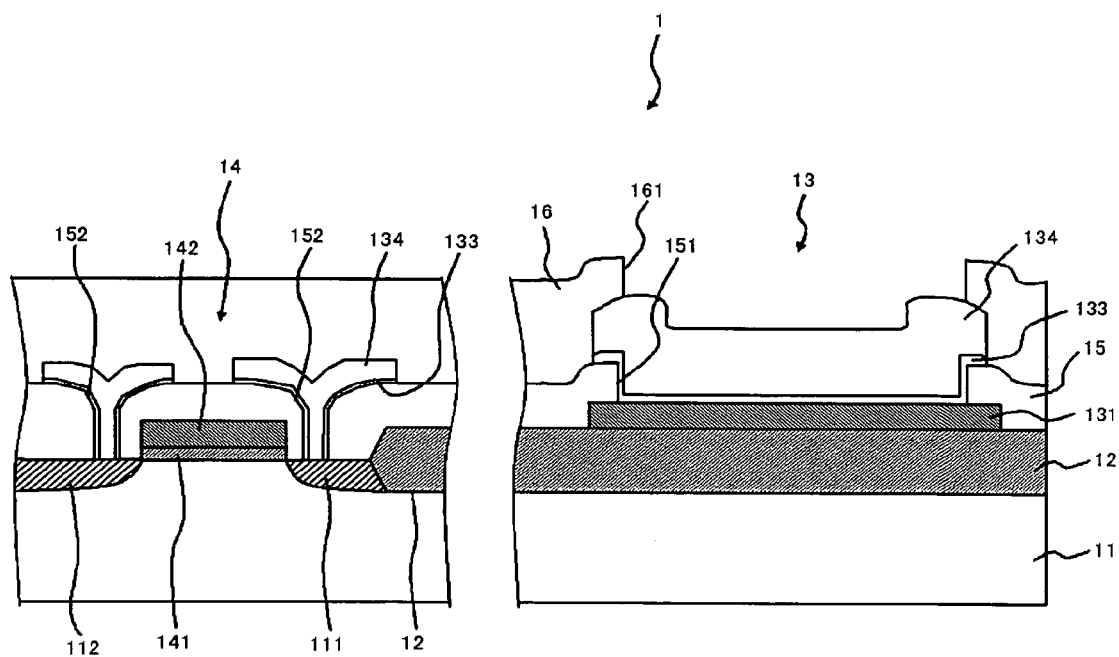
FIG. 1 is a cross-sectional view of a semiconductor device of an embodiment according to the present invention.

Preferable embodiments according to the present invention will be described as follows, in reference to the annexed figures. FIG. 1 shows a cross-sectional view of a semiconductor device 1 according to the present embodiment. The semiconductor device 1 includes a silicon substrate 11 serving as a semiconductor substrate, a field oxide film 12 provided on the silicon substrate 11, a bonding pad section 13 formed on the field oxide film 12, a gate electrode 14 formed in a device region on the silicon substrate 11, an interlayer insulating film 15, and a cover film 16 serving as another insulating film. The bonding pad section 13 includes a polysilicon film 131 provided on the field oxide film 12, a barrier metal film 133 provided on the polysilicon film 131, and a metallic electrode 134 provided on the barrier metal film 133. The polysilicon film 131 contains substantially no phosphorus. Here, the status that "the polysilicon film 131 contains substantially no phosphorus" additionally includes a status that the polysilicon film 131 contains a trace amount of phosphorus at a level of not larger than the minimum detectable quantity for an Auger spectrometry apparatus or a secondary ion mass spectrometry apparatus, in addition to a status that the polysilicon film 131 contain absolutely no phosphorus. In addition, the status that "the polysilicon film 131 contains substantially no phosphorus" means a status that phosphorus is not intentionally added thereto, and thus also includes a status that phosphorus is inevitably contained therein.

Further, the surface roughness of the surface of the polysilicon film 131 in the side of the barrier metal film 133 is equal to or larger than 3 nm. The surface roughness as set forth here is an arithmetic mean roughness, which can be measured by AFM (Atomic Force Microscope), for example. The polysilicon film not doped with phosphorus tends to maintain a convexo-concave surface due to the face of polysilicon grains, resulting in the surface roughness of 3 nm or more.

Here, the polysilicon film 131 may contain arsenic, and arsenic concentration in the surface of the polysilicon film 131 in the side of the barrier metal film 133 may be preferably equal to or higher than $1\times10^{20}$ cm$^{-3}$. Further, arsenic concentration in the surface of the polysilicon film 131 in the side of the barrier metal film 133 may be preferably equal to or lower than $1\times10^{21}$ cm$^{-3}$. Further, the thickness of the polysilicon film 131 may be preferably within a range of from to 100 nm to 2,000 nm.

A device region, which is insulatively isolated via the field oxide film 12, is formed on the silicon substrate 11, and a gate electrode 14 is formed on the device region. Further, a source region 111 and a drain region 112 are formed on the silicon substrate 11 so as to interleave the gate electrode 14 therebetween. The gate electrode 14 includes a gate oxide film 141 and a polysilicon film 142 provided on the gate oxide film 141. The polysilicon film 142 that composes the gate electrode 14 is doped with phosphorus.

The interlayer insulating film 15 is provided so as to cover the gate electrode 14 and the polysilicon film 131 in the bonding pad section 13. A portion of the interlayer insulating film 15 above the polysilicon film 131 has an opening, and the barrier metal film 133 and the metallic electrode 134 provided on the barrier metal film 133 are formed in an aperture 151 of the interlayer insulating film 15. Further, contact holes 152 vertically extending to the source region 111 and the drain region 112, respectively, are formed in the interlayer insulating film 15, and the barrier metal film 133 and the metallic electrode 134 are formed to fill the contact hole 152.

The cover film 16 is provided on the interlayer insulating film 15, and a portion of the cover film 16 above the polysilicon film 131 is provided with an aperture 161 formed therein.

Figure 2:
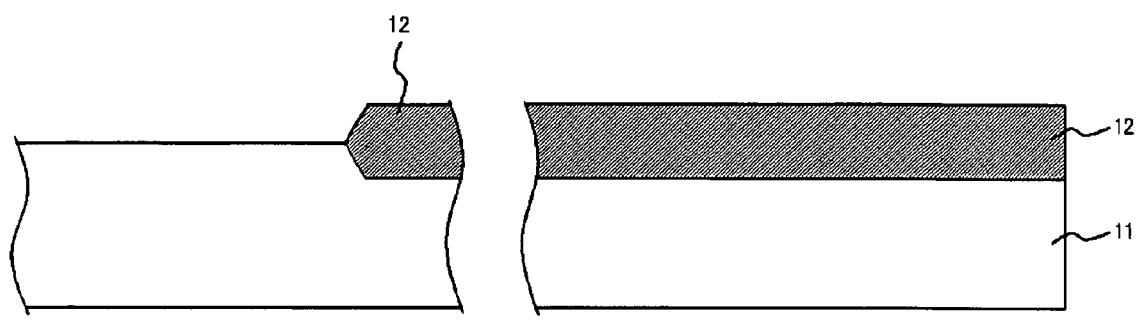
FIG. 2 is a cross-sectional view of the semiconductor device of the embodiment, useful in describing a process for manufacturing the semiconductor device.
Figure 3:
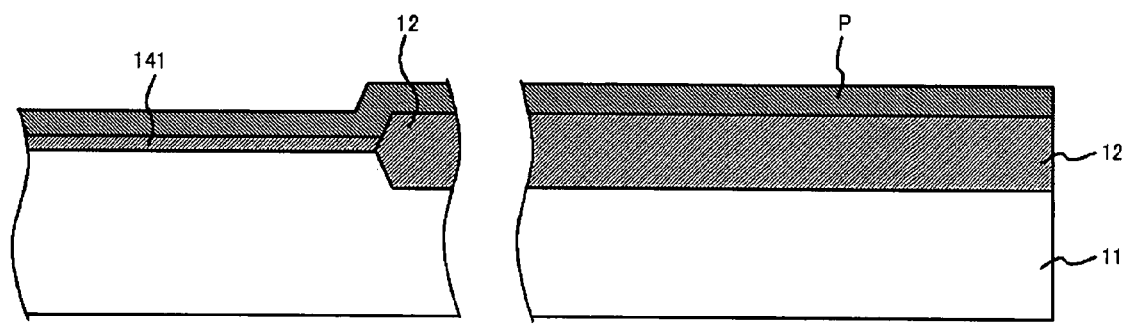
FIG. 3 is a cross-sectional view of the semiconductor device of the embodiment, useful in describing the process for manufacturing the semiconductor device.

Next, a process for manufacturing such type of semiconductor device 1 will be described in reference to FIG. 2 to FIG. 5. As shown in FIG. 2, the field oxide film 12 is formed on the silicon substrate 11 to form a predetermined pattern. Next, as shown in FIG. 3, the silicon oxide film 141 is formed in a portion of the silicon substrate 11 where field oxide film 12 is not formed (i.e., device region). Then, a polysilicon film P is deposited so as to cover the field oxide film 12 and further to extend on the silicon oxide film 141. The polysilicon film P will serve as the polysilicon film 142 that composes the gate electrode 14 and as the polysilicon film 131 that composes the bonding pad section 13.

A mask having a predetermined pattern is formed on the polysilicon film P by employing a photo resist, and the formed polysilicon film P is then etched. This processing achieves a formation of the polysilicon film 142 that composes the gate electrode 14, and also achieves a formation of the polysilicon film 131 that composes the bonding pad section 13. In addition to above, the silicon oxide film 141 is simultaneously etched, along with the etching of the polysilicon film P.

Figure 4:
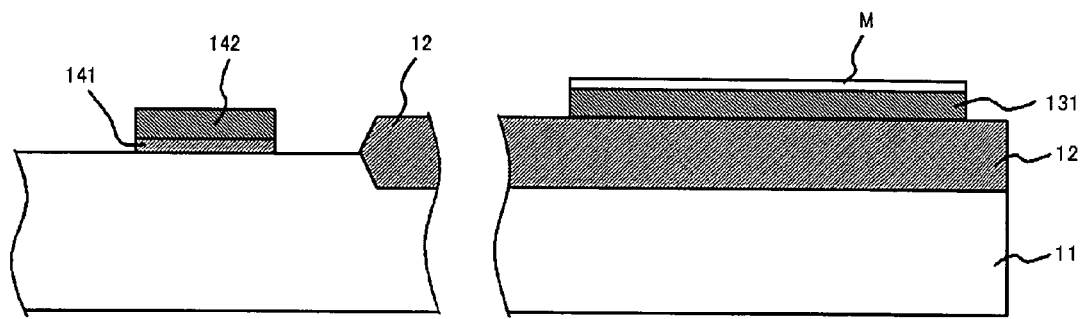
FIG. 4 is a cross-sectional view of the semiconductor device of the embodiment, useful in describing the process for manufacturing the semiconductor device.
Figure 5:
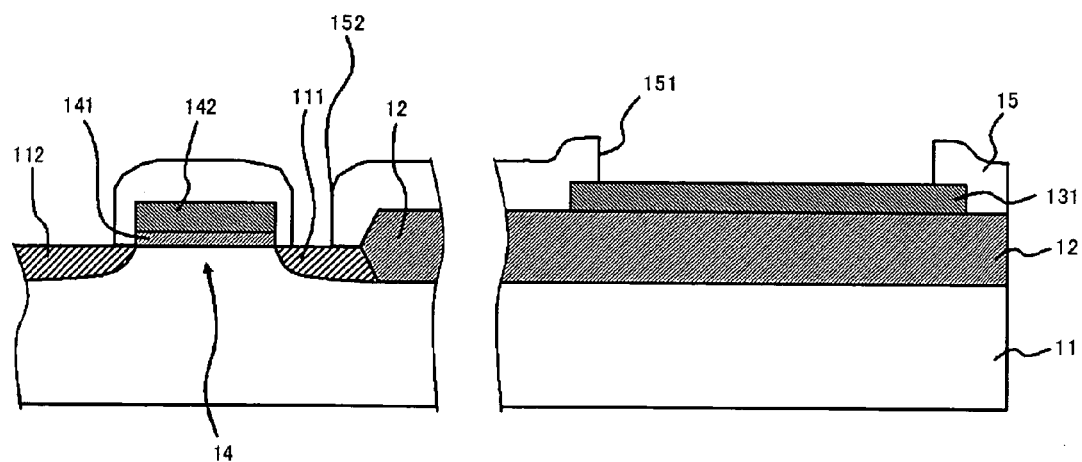
FIG. 5 is a cross-sectional view of the semiconductor device of the embodiment, useful in describing the process for manufacturing the semiconductor device.

Thereafter, as shown in FIG. 4, a mask M is formed on the polysilicon film 131 that composes the bonding pad section 13. Next, phosphorus is doped into the polysilicon film 142 of the gate electrode 14. In such case, since the polysilicon film 131 that composes the bonding pad section 13 is masked, the polysilicon film 131 that composes the bonding pad section 13 is not doped with phosphorus.

Next, the device region of the silicon substrate 11 is doped with arsenic to form the source region 111 and the drain region 112. Before arsenic is doped, the mask M may be formed on the polysilicon film 131 that composes the bonding pad section 13, or the mask M may not be formed on the polysilicon film 131 that composes the bonding pad section 13. More specifically, the polysilicon film 131 that composes the bonding pad section 13 may contain arsenic, or may contain no arsenic. Thereafter, the interlayer insulating film 15 is formed so as to cover the polysilicon film 131 that composes the bonding pad section 13 and the gate electrode 14. A mask having a predetermined pattern is formed on the interlayer insulating film 15, and an etching process is conducted to form the contact hole 152 and to form the aperture 151 on the polysilicon film 142 (see FIG. 5).

Next, a combination of the barrier metal film 133 and the metallic electrode 134 is formed in each of the aforementioned aperture 151 and the contact holes 152. Thereafter, the cover film 16 is formed, and predetermined portions thereof are selectively etched off to form an aperture 161 (see FIG. 1).

Next, advantageous effects obtainable by employing the configuration of the semiconductor device 1 will be described. Since the surface roughness of the polysilicon film 131 of the bonding pad section 13 is equal to or larger than 3 nm in the configuration according to the present embodiment, larger surface area of the polysilicon film 131 contacting with the barrier metal film 133 (contact area) can be ensured, so that the adhesion of the barrier metal film 133 with the polysilicon film 131 can be ensured. This configuration prevents a flaking of the bonding pad section 13. Further, the polysilicon film 131 of the bonding pad section 13 according to the present embodiment contains substantially no phosphorus. It is assumed that the surface of the polysilicon film 131 is smoothed, along with an oxidization thereof. More specifically, it is considered that the surface of the polysilicon film is smoothed by forming an oxide film on the surface of the polysilicon film 131 to cover thereof. It is considered that phosphorus functions as accelerating an oxidization of the surface of the polysilicon film 131, and therefore an oxidization of the surface of the polysilicon film 131 can be inhibited by employing a material for the polysilicon film 131 that contains substantially no phosphorus, thereby preventing a decrease in the surface area of the polysilicon film 131 adhered to the barrier metal film 133. This configuration ensures an adhesion of the barrier metal film 133 with the polysilicon film 131.

Further, a more coarse surface of the polysilicon film 131 can be obtained by injecting arsenic in the polysilicon film 131, so that an improved adhesion of the barrier metal film 133 with the polysilicon film 131 can be further ensured. While arsenic concentration at the surface of the polysilicon film 131 near the barrier metal film 133 of less than $1\times10^{20}$ $cm^{-3}$, if the arsenic concentration is selected to be equal to or higher than $1\times10^{20}$ $cm^{-3}$, an increased surface roughness of the surface of the polysilicon film 131 near the barrier metal film 133 can be ensured.

Further, the present embodiment involves depositing the polysilicon film P so as to cover the field oxide film 12 and further to extend over the silicon oxide film 141, and then etching the deposited film, so that the polysilicon film 131 that composes the bonding pad section 13 and the polysilicon film 142 that composes the gate electrode 14 are formed. More specifically, since the deposition of the polysilicon film 131 of the bonding pad section 13 is achieved simultaneously with the deposition the polysilicon film 142 that composes the gate electrode 14, a need for conducting a complicated procedure for manufacturing the semiconductor device 1 can be avoided, as compared with a manufacturing process for forming these films in different deposition process steps.

It is to be emphasized that the scope and the spirit of the present invention is not limited to the above-described preferred embodiment, and it should be construed that any alternatives or any modifications thereof are within the scope of the present invention, as long as the object of the present invention can be achieved. For example, while the deposition of the polysilicon film 131 of the bonding pad section 13 is achieved simultaneously with the deposition the polysilicon film 142 that composes the gate electrode 14 in the above-described embodiment, the present invention is not limited thereto, and the deposition of the polysilicon film 131 of the bonding pad section 13 and the deposition of the polysilicon film 142 that composes the gate electrode 14 may not be simultaneously conducted.

Figure 6:
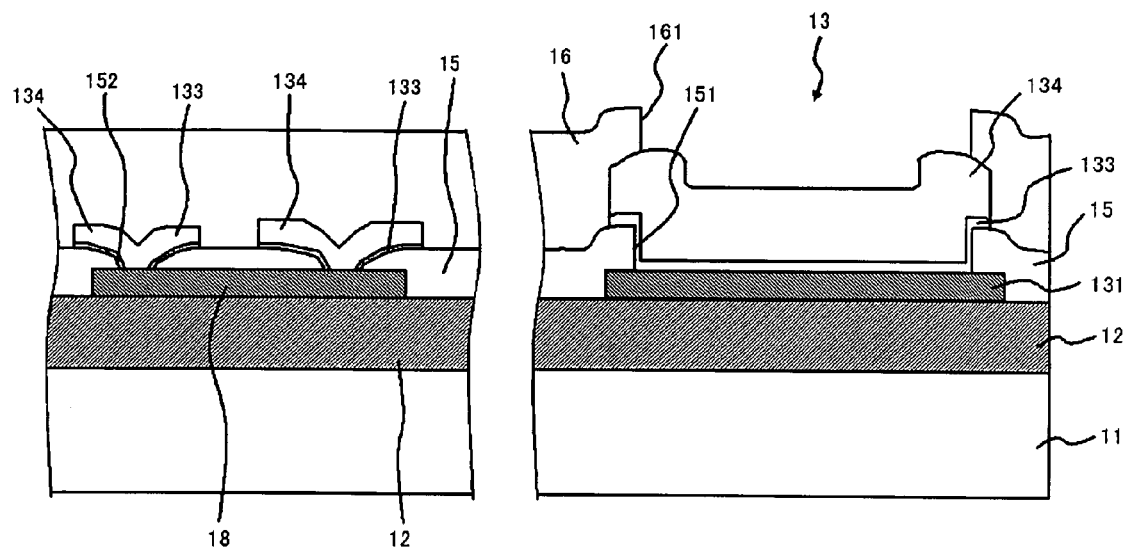
FIG. 6 is a cross-sectional view of a semiconductor device of an alternative embodiment according to the present invention.

Further, as shown in FIG. 6, the deposition of the polysilicon film 131 of the bonding pad section 13 may be simultaneously conducted with the deposition of a polysilicon film 18 that composes a resistive element mounted on the field oxide film 12. More specifically, a polysilicon film may be deposited in a region for forming a bonding pad section and a region for forming a resistive element on the field oxide film 12, so that the deposited polysilicon film horizontally extends over these regions. Then, the deposited polysilicon film is selectively removed to form the polysilicon film 131 that composes the bonding pad section 13 and to form the polysilicon film 18 that composes the resistive element. Thereafter, the polysilicon film 131 that composes the bonding pad section 13 is masked with a mask, and the above-described exposed polysilicon film 18 that composes the resistive element is doped with phosphorus. Further, the barrier metal film 133 and the metallic electrode 134 provided on the barrier metal film 133 are formed on the polysilicon film 131 that composes the bonding pad section 13, similarly as in the above-described preferable embodiment. In addition to above, the polysilicon film 131 may be doped with arsenic, similarly as in the above-described preferable embodiment.

Further, the deposition of the polysilicon film 131 of the bonding pad section 13, the deposition of the polysilicon film 142 that composes the gate electrode 14 and the deposition of the polysilicon film 18 that composes the resistive element mounted on the field oxide film 12 may be simultaneously conducted. A polysilicon film horizontally extending over the field oxide film and the device region of the silicon substrate may be formed, similarly as in the above-described embodiment, and the deposited polysilicon film is selectively removed, so that the polysilicon film that composes the gate electrode and the polysilicon film that composes the bonding pad section may be formed, and the polysilicon film that composes the resistive element may also additionally be formed. In addition to above, when the polysilicon film composing the resistive element and the polysilicon film composing the gate electrode are doped with phosphorus, the polysilicon film 131 of the bonding pad section 13 is masked with a mask. Process steps conducted thereafter are similar to that employed in the above-described embodiment.

Further, while arsenic concentration in the surface of the polysilicon film 131 is selected to be equal to or higher than $1\times10^{20}$ $cm^{-3}$ when the polysilicon film 131 contains arsenic in the above-described embodiment, arsenic concentration thereof is not limited thereto, and may be lower than $1\times10^{20}$ $cm^{-3}$. Further, while the polysilicon film of the bonding pad section illustrated in the above-described embodiment or illustrated in the alternative configuration shown in FIG. 6 contains substantially no phosphorus, the nature of the polysilicon film is not limited thereto, and the polysilicon film may contain phosphorus in the surface of the polysilicon film in the side of the barrier metal film at a concentration of equal to or lower than $5\times10^{16}$ $cm^{-3}$. If phosphorus concentration at the surface of the polysilicon film near the barrier metal film is equal to or lower than $5\times10^{16}$ $cm^{-3}$, an oxidization of the surface of the polysilicon film 131 hardly occurs and a greater surface area of a portion of the polysilicon film 131 adhered onto the barrier metal film 133 can be achieved.

EXAMPLES

A relationship of a rate of flaking occurrence in a bonding pad section over a surface roughness of a polysilicon film was investigated. Polysilicon films having different surface roughness of surfaces in the side of the barrier metal film were employed to manufacture semiconductor devices having structures that are similar to that employed in the above-described embodiment, and then a rate of flaking occurrence in a bonding pad section was examined. More specifically, 120 pieces of semiconductor devices were manufactured for each of the surface roughness of the polysilicon films (thickness: 470 nm), and bonding processes were conducted with a predetermined load and a predetermined force for these devices and number of defective devices that involve flaking of the bonding pad section were counted to calculate a rate of flaking occurrence in the bonding pad section. The surface roughness of the polysilicon film were measured by AFM (Atomic Force Microscope).

Figure 7:
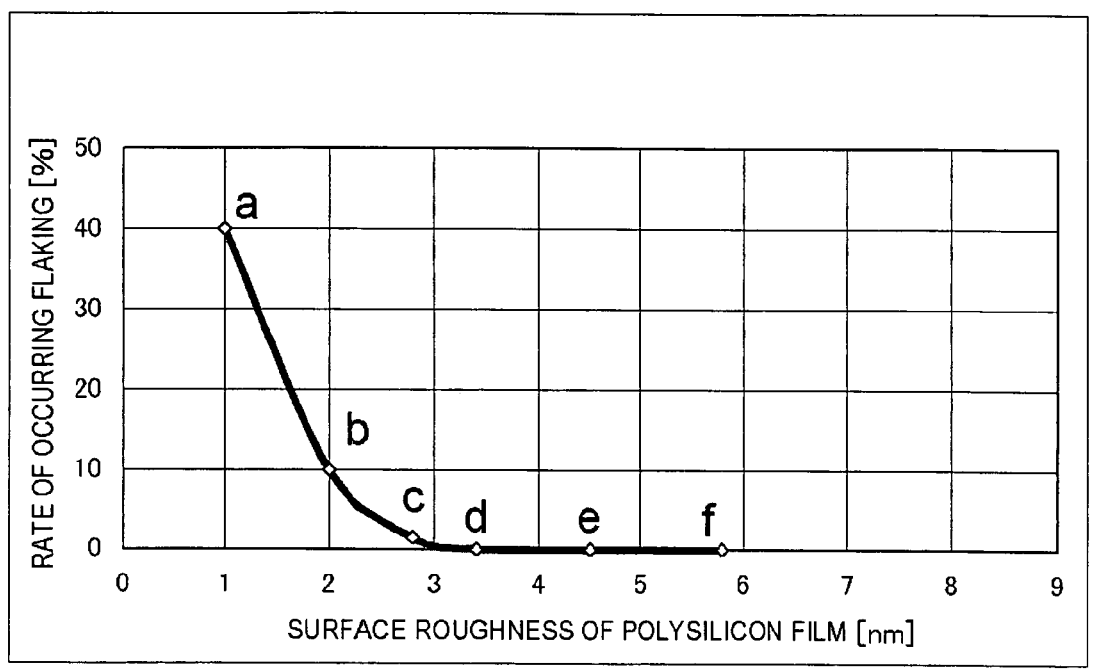
FIG. 7 is a graph, showing a relationship of a rate of occurring a flaking in the bonding pad section with the surface roughness of the polysilicon film in an example.
Figure 8:
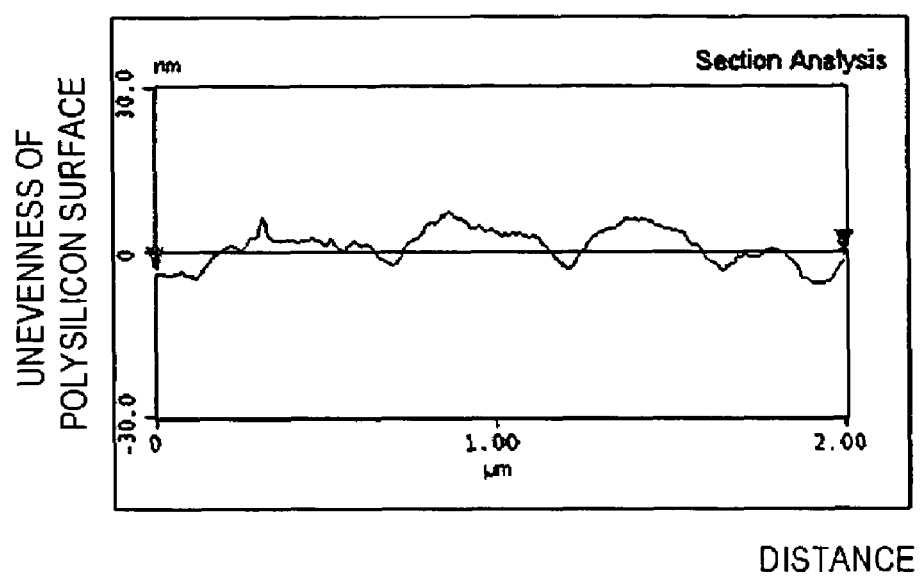
FIG. 8 is a graph, showing a surface condition of the polysilicon film that contains phosphorus in the surface of the polysilicon film in the side of the barrier metal film at a concentration of $1 \times 10^{20}$ cm$^{-3}$.
Figure 9:
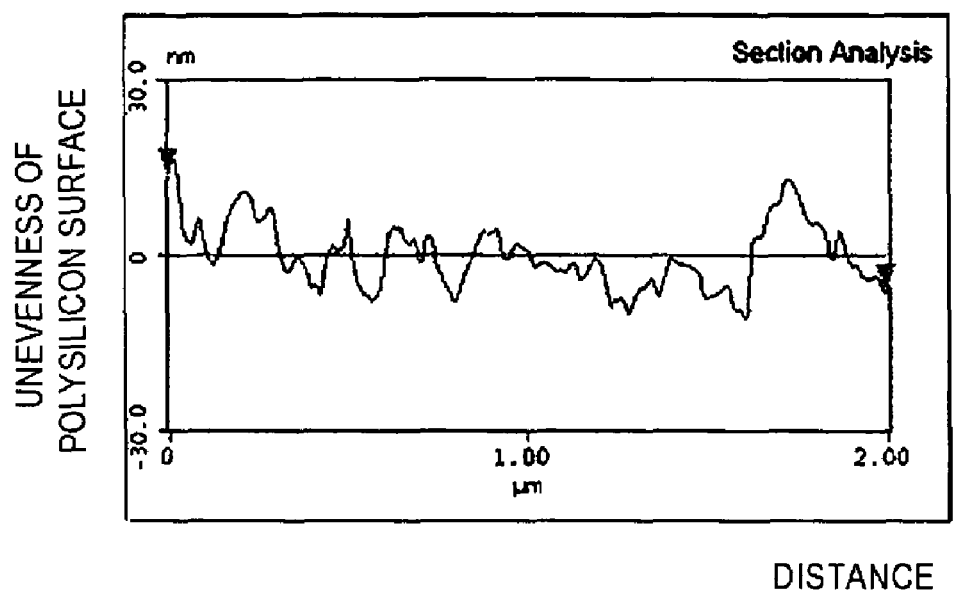
FIG. 9 is a graph, showing a surface condition of the polysilicon film that contains substantially no phosphorus.
Figure 10:
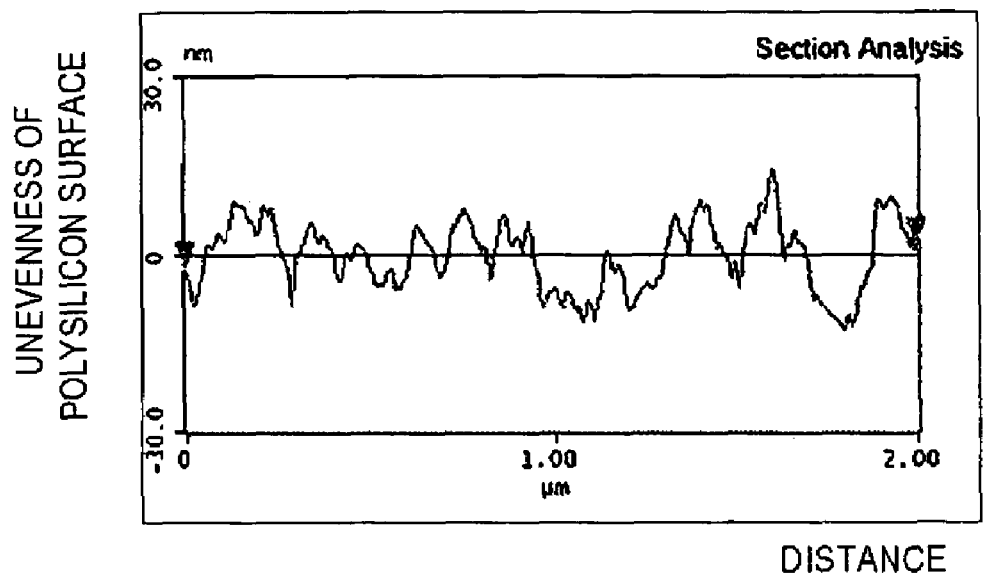
FIG. 10 is a graph, showing a surface condition of the polysilicon film that contains arsenic in the surface of the polysilicon film in the side of the barrier metal film at a concentration of $1 \times 10^{20}$ cm$^3$.
Figure 11:
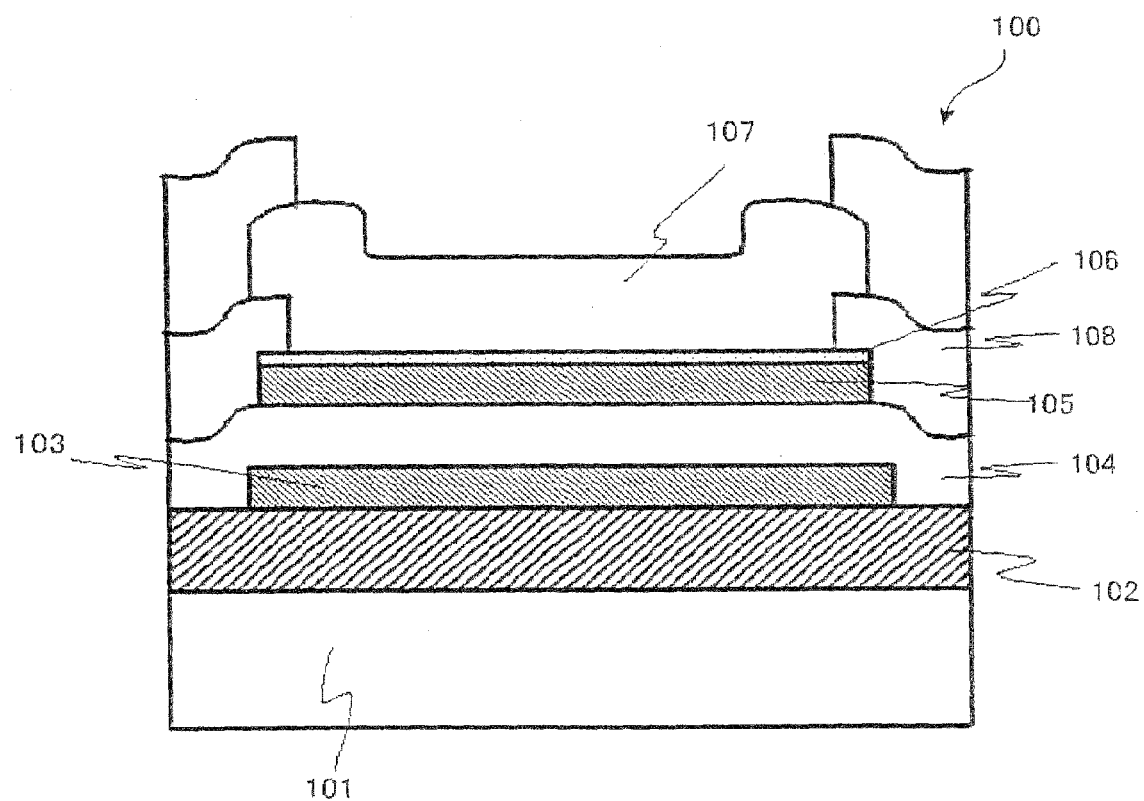
FIG. 11 is a cross-sectional view of a conventional semiconductor device.

The results are shown in FIG. 7. A polysilicon film corresponding to a point "a" shown in FIG. 7 is a film doped with phosphorus, and a concentration of phosphorus contained in the surface of the polysilicon film in the side of the barrier metal film is $1\times10^{20}$ $cm^{-3}$. In addition to above, the condition of unevenness in the surface of the polysilicon film provided by the point "a" shown in FIG. 7 is shown in FIG. 8. A polysilicon film corresponding to a point "b" is also a film doped with phosphorus, and a concentration of phosphorus contained in the surface of the polysilicon film in the side of the barrier metal film is $8\times10^{17}$ cm$^{-3}$. A polysilicon film corresponding to a point "c" is also a film doped with phosphorus, and a concentration of phosphorus contained in the surface of the polysilicon film in the side of the barrier metal film is $1-10^{17}$ cm$^{-3}$. A polysilicon film corresponding to a point "d" is a film which is doped with phosphorus, and a concentration of phosphorus contained in the surface of the polysilicon film in the side of the barrier metal film is $5\times10^{16}$ cm$^{-3}$. A polysilicon film corresponding to a point "e" is a film that is not doped with phosphorus, and thus the film contains substantially no phosphorus. In addition to above, condition of unevenness in the surface of the polysilicon film provided by the point "e" shown in FIG. 7 is shown in FIG. 9. The polysilicon film provided by the point "e" is a film that is not doped with phosphorus, and thus the film contains substantially no phosphorus. Further, a polysilicon film corresponding to a point "f" is a film doped with arsenic, and a concentration of arsenic contained in the surface of the polysilicon film in the side of the barrier metal film is $1\times10^{20}$ cm$^{-3}$. In addition to above, condition of unevenness in the surface of the polysilicon film provided by the point "f" shown in FIG. 7 is shown in FIG. 10. As can be seen from FIG. 7, it can be understood that a flaking of the bonding pad section can be prevented by selecting the surface roughness in the surface of the polysilicon film in the side of the barrier metal film as equal to or larger than 3 nm. It is apparent that the present invention is not limited to the above embodiment, that may be modified and changed without departing from the scope and spirit of the invention.

What is claimed is:

1. A semiconductor device, comprising:
    a semiconductor substrate;
    a gate oxide film formed on a first region of said substrate;
    a gate electrode including a first polysilicon film contacting said gate oxide film,
    a field oxide film formed on a second region of said semiconductor substrate; and
    a bonding pad section formed on said field oxide film,
    wherein said bonding pad section includes:
    a second polysilicon film provided on said field oxide film, the second polysilicon film being of a material different from the first polysilicon film;
    an interlayer insulating film provided on said second polysilicon film, a contact hole exposing a part of said second polysilicon film therefrom being provided in said interlayer insulating film;
    a barrier metal film provided on said interlayer insulating film and said polysilicon film extending through said contact hole; and
    a metallic electrode provided on said barrier metal film, and
    wherein a surface roughness of a surface of said second polysilicon film in a side of said barrier metal film is equal to or larger than 3 nm.

2. The semiconductor device according to claim 1, wherein the surface roughness of the surface of said second polysilicon film in the side of said barrier metal film is equal to or lower than 20 nm.

3. The semiconductor device according to claim 1, wherein said second polysilicon film contains substantially no phosphorus.

4. The semiconductor device according to claim 3, wherein a device region insulatively isolated via said field oxide film is formed on said semiconductor substrate, the gate electrode including the first polysilicon film is formed in said device region, and the first polysilicon film composes said gate electrode contains phosphorus.

5. The semiconductor device according to claim 1, wherein a concentration of phosphorus in the surface of said second polysilicon film in the side of said barrier metal film is equal to or lower than $5\times10^{16}$ cm$^{-3}$.

6. The semiconductor device according to claim 1, wherein the second polysilicon film of said bonding pad section contains arsenic, and
    a concentration of the arsenic in the surface of said second polysilicon film in the side of said barrier metal film is equal to or higher than $1\times10^{20}$ cm$^{-3}$.

7. The semiconductor device according to claim 1, wherein the first polysilicon film is doped with phosphorus.

8. The semiconductor device according to claim 7, wherein the second polysilicon film contains substantially no phosphorus.

9. The semiconductor device according to claim 8, wherein concentration of the phosphorus in the surface of said second polysilicon film in the side of said barrier metal film is equal to or lower than $5\times10^{16}$ cm$^{-3}$.

10. The semiconductor device according to claim 8, wherein the second polysilicon film of said bonding pad section contains arsenic, and
    a concentration of the arsenic in the surface of said second polysilicon film in the side of said barrier metal film is equal to or higher than $1\times10^{20}$ cm$^{-3}$.

11. The semiconductor device according to claim 10, wherein concentration of the phosphorus in the surface of the said second polysilicon film in the side of said barrier metal film is equal to or lower than $5\times10^{16}$ cm$^{-3}$.

12. The semiconductor device according to claim 1, wherein the second polysilicon film of said bonding pad section contains arsenic, and
    a concentration of the arsenic in the surface of said second polysilicon film in the side of said barrier metal film is equal to or lower than $1\times10^{21}$ cm$^{-3}$.

13. The semiconductor device according to claim 1, wherein the second polysilicon film of said bonding pad section has a thickness of from 100 nm to 2,000 nm.

14. A semiconductor device, comprising:
    a semiconductor substrate;
    a gate oxide film formed on a first region of said substrate;
    a gate electrode including a first polysilicon film contacting said gate oxide film,
    a field oxide film formed on a second region of said semiconductor substrate; and
    a bonding pad section formed on said field oxide film,
    wherein said bonding pad section includes:
    a second polysilicon film provided on said field oxide film, the second polysilicon film being of a material different from the first polysilicon film;
    an interlayer insulating film provided on said second polysilicon film, a contact hole exposing a part of said second polysilicon film therefrom being provided in said interlayer insulating film;
    a barrier metal film provided on said interlayer insulating film and said polysilicon film extending through said contact hole; and
    a metallic electrode provided on said barrier metal film, and
    wherein a surface roughness of a surface of said second polysilicon film in a side of said barrier metal film is equal to or larger than 3 nm, whereby the surface roughness of larger than 3 nm promotes adhesion.

15. The semiconductor device according to claim 14, wherein the surface roughness of the surface of said second polysilicon film in the side of said barrier metal film is equal to or lower than 20 nm.

16. The semiconductor device according to claim 14, wherein said second polysilicon film contains substantially no phosphorus.

17. The semiconductor device according to claim 16, wherein a device region insulatively isolated via said field oxide film is formed on said semiconductor substrate, the gate electrode including the first polysilicon film is formed in said device region, and the first polysilicon film composes said gate electrode contains phosphorus.

18. The semiconductor device according to claim 14, wherein concentration of phosphorus in the surface of said second polysilicon film in the side of said barrier metal film is equal to or lower than $5 \times 10^{16}$ cm$^{-3}$.

19. The semiconductor device according to claim 14, wherein the second polysilicon film of said bonding pad section contains arsenic to promote the surface roughness and adhesion, and a concentration of the arsenic in the surface of said second polysilicon film in the side of said barrier metal film is equal to or higher than $1 \times 10^{20}$ cm$^{-3}$.

20. The semiconductor device according to claim 14, wherein the first polysilicon film is doped with phosphorus.

\* \* \* \* \*